(12) United States Patent
Hynd

(10) Patent No.: US 6,323,730 B1
(45) Date of Patent: Nov. 27, 2001

(54) HIGH RESOLUTION ZERO INPUT CURRENT CHARGE SENSITIVE PREAMPLIFIER

(75) Inventor: John William Hynd, Williamsville, NY (US)

(73) Assignee: PCB Piezotronics, Inc., Depew, NY (US)

( * ) Notice: Subject to any disclaimer, the term of this patent is extended or adjusted under 35 U.S.C. 154(b) by 0 days.

(21) Appl. No.: 09/686,411

(22) Filed: Oct. 11, 2000

Related U.S. Application Data

(63) Continuation of application No. 09/302,925, filed on Apr. 30, 1999, now abandoned.

(51) Int. Cl.[7] ............................................... H03F 1/36
(52) U.S. Cl. ..................................... 330/85; 330/311
(58) Field of Search ............................. 330/85, 107, 109, 330/110, 253, 260, 194, 311, 9; 327/307

(56) References Cited

U.S. PATENT DOCUMENTS

| | | | |
|---|---|---|---|
| 3,509,460 | * | 4/1970 | Mizrahi ................................. 324/111 |
| 3,768,028 | * | 10/1973 | Wolcott et al. .......................... 330/2 |
| 3,908,173 | * | 9/1975 | Murdock ............................. 330/30 D |
| 4,752,744 | * | 6/1988 | Aoki ..................................... 330/252 |
| 5,347,231 | | 9/1994 | Bertuccio et al. . |
| 5,394,113 | * | 2/1995 | Belcher ................................ 330/260 |

OTHER PUBLICATIONS

Giuseppe, Bertuccio, Pavel Rehak and Deming Xi. "A novel charge sensitive preamplifier without the feedback resistor." Nuclear Instruments and Methods in Physics Research, Elsevier Science Publishers B.V., 1993, pp. 71–76.

* cited by examiner

*Primary Examiner*—Robert Pascal
*Assistant Examiner*—Henry Choe
(74) *Attorney, Agent, or Firm*—Simpson, Simpson & Snyder, PLLC

(57) ABSTRACT

A zero input current charge sensitive preamplifier comprised of a feedback means and, optionally, a charge cancellation means whereby the feedback means is comprised of a feedback loop having a feedback capacitor and a composite operational amplifier having a non-inverting input and being comprised of a common drain differential amplifier, having at least one junction field effect transistor which is coupled with a monolithic operational amplifier; and wherein the charge cancellation means is comprised of an integrator placed in the feedback loop at the non-inverting input of the composite operational amplifier.

1 Claim, 3 Drawing Sheets

HIGH RESOLUTION ZERO INPUT CURRENT CHARGE SENSITIVE PREAMPLIFIER

This is a continuation of U.S. patent application Ser. No. 09/302,925, filed on Apr. 30, 1999, now abandoned.

FIELD OF THE INVENTION

This invention relates to a novel charge sensitive preamplifier, more particularly it relates to a charge amplifier that utilizes a feedback loop to actively control input transistor gate leakage and additionally filter undesirable low frequency signals, thereby allowing removal of the feedback resistor which is the primary source of noise at low frequency.

BACKGROUND OF THE INVENTION

Charge sensitive preamplifiers are commonly used as impedance converters for signals generated by a charge output sensor. A piezoelectric sensor is one such type of device and is widely used as a means of measuring some mechanical quantity, such as acceleration, pressure or force. As dynamic devices, piezoelectric sensors sense only changes in applied stresses, not static stresses. In addition to sensing changes in applied stress, many piezoelectric materials also sense changes in temperature i.e., pyroelectric response, and will produce a charge due to the change in temperature. In order to obtain the most accurate readings for mechanical stress, the charge due to the pyroelectric response must be attenuated since the charge resulting from the pyroelectric response and mechanical stress are indistinguishable.

In recent years data acquisition systems have had a profound increase in resolution resulting in a need for an improvement in sensor resolution. The resolution of a conventional charge amplifier, however, is inherently limited.

The circuit shown in FIG. 1 is a schematic of a classical conventional charge sensitive preamplifier (hereinafter referred to as the "Classical CSP") used to amplify high impedance signals in a large number of applications, including piezoelectric force, pressure and acceleration sensors, pyroelectric detectors, piezoelectric hydrophones and nuclear particle detectors. The use of charge sensitive preamplifiers dates back to the 1940's. The amplifier of FIG. 1 contains a physical resistor ($R_f$) in parallel with a capacitor ($C_f$) in a feedback loop. The output voltage is related to the desired piezoelectric signal, ($q_p$) by the ratio $v_o = q_p / C_f$. Any undesirable low frequency charge signal ($q_t$) usually associated with pyroelectric response is attenuated via $R_f$ which forms a high pass filter with $C_f$.

Inherently, piezoelectric sensors have very low noise. Therefore the resolution of the measurement is determined by the amplifier used to transform the high impedance charge output of the sensing element into a low impedance output voltage.

The primary source of noise that limits the performance of the Classical CSP at low frequencies is $R_f$. Analysis shows that to have the lowest noise, $R_f$ has to have a very high resistance value, in the range of several thousands of megaohms. This approach to reducing noise becomes impractical, however, because the amplifier's leakage current will generate a DC voltage across the feedback resistor. Furthermore, increasing the feedback resistor increases the low frequency response, allowing undesirable pyroelectric signals to pass.

Several attempts have been made to eliminate the feedback resistor to improve resolution of other types of charge sensors, but each has introduced a new set of problems. As a result there remains a need in the industry for a commercially practical improved device.

One solution would appear to be to eliminate $R_f$ from the feedback loop. But this solution is also not practical because if $R_f$ is eliminated there no longer exists a discharge path for $C_f$. $R_f$ provides a path for the DC current flow ($I_{DC}$). Without the resistor the current would charge $C_f$ until the amplifier output saturated.

U.S. Pat. No. 4,801,838, Beauducel et al., proposed a configuration that uses a switched capacitor impedance transformation scheme to lower the noise gain of the amplifier. The patent claims to maintain the signal gain for the resultant increase in resolution. Practice, however, has shown that the decrease in noise gain is accompanied by a decrease in signal gain so the resolution is not effectively improved. In addition the system is much too complex to be commercially practical.

U.S. Pat. No. 4,816,713, Change, Jr. likewise fails to provide an improvement over the classical charge sensitive capacitor and teaches a sensor having a complex construction which is difficult to implement.

U.S. Pat. No. 4,053,847, Kumshara, et al., discloses a circuit for use in semiconductor radiation detectors in which feedback is used to adjust the drain voltage of the input JFET, so that the feedback resistor may be eliminated. However, the configuration of this invention is not compatible with piezoelectric sensors since it requires a low level DC current source at the input (supplied by the radiation detector) to match the gate leakage current of the JFET and also because its output has a DC bias voltage that is variable according to the voltage commanded to the drain. Further, this circuit fails to provide a means of attenuating the pyroelectric output of piezoelectric sensors at low frequencies.

A variation of the invention disclosed in U.S. Pat. No. 4,053,847 is disclosed in U.S. Pat. No. 5,347,231, Bertuccio, et al. By there invention, Bertuccio et al., sought to provide a device that would eliminate the inherent leakage current of the charge sensitive preamplifier through the use of a dual feedback scheme. Bertuccio's feedback scheme also eliminated the resistor of the conventional feedback network. However, Bertuccio, et al.'s circuit is similar to that of Kumshara, et, al. in that it fails to provide sufficient attenuation of undesired low frequency signals and has a DC output level which is non-zero and dependent upon the input transistor characteristics which can vary with processing.

Bertuccio, et al.'s circuit appears to have been designed with the needs of the nuclear industry in mind. The standards in the nuclear industry differ from those in the piezoelectric industry, as a result, Bertuccio, et al.'s invention does not provide a commercially practical solution for the piezoelectric industry to the age long problem.

Thus, the foregoing inventions have each failed to meet the needs of the piezoelectric industry for an improved charge sensitive preamplifier.

SUMMARY OF THE INVENTION

The present invention comprises a zero input current charge sensitive preamplifier comprised of a feedback means and, optionally, a charge cancellation means. The feedback means is comprised of a feedback loop having a feedback capacitor and a composite operational amplifier having a non-inverting input and being comprised of a common drain differential JFET amplifier, having at least one junction field effect transistor which is coupled to a monolithic operational amplifier. The charge cancellation means is comprised of an integrator placed in the feedback loop at the non-inverting input of the composite operational amplifier.

It is an object of this invention to provide a charge amplifier that utilizes an active feedback loop to control transistor gate leakage which eliminates the need for a high value resistor, thus improving resolution.

It is a further object of this invention to provide a charge amplifier that utilizes an active feedback loop to control transistor gate leakage and filter undesirable low frequency signals and which eliminates the drift associated with gate leakage.

It is still another object of this invention to provide a charge amplifier that utilizes an active feedback loop to control transistor gate leakage and filter undesirable low frequency signals and which is commercially practical for use in connection with piezoelectric sensor technology.

Other objects and advantages of this invention will be apparent from the description presented below.

DETAILED DESCRIPTION OF THE INVENTION

Figure 2:
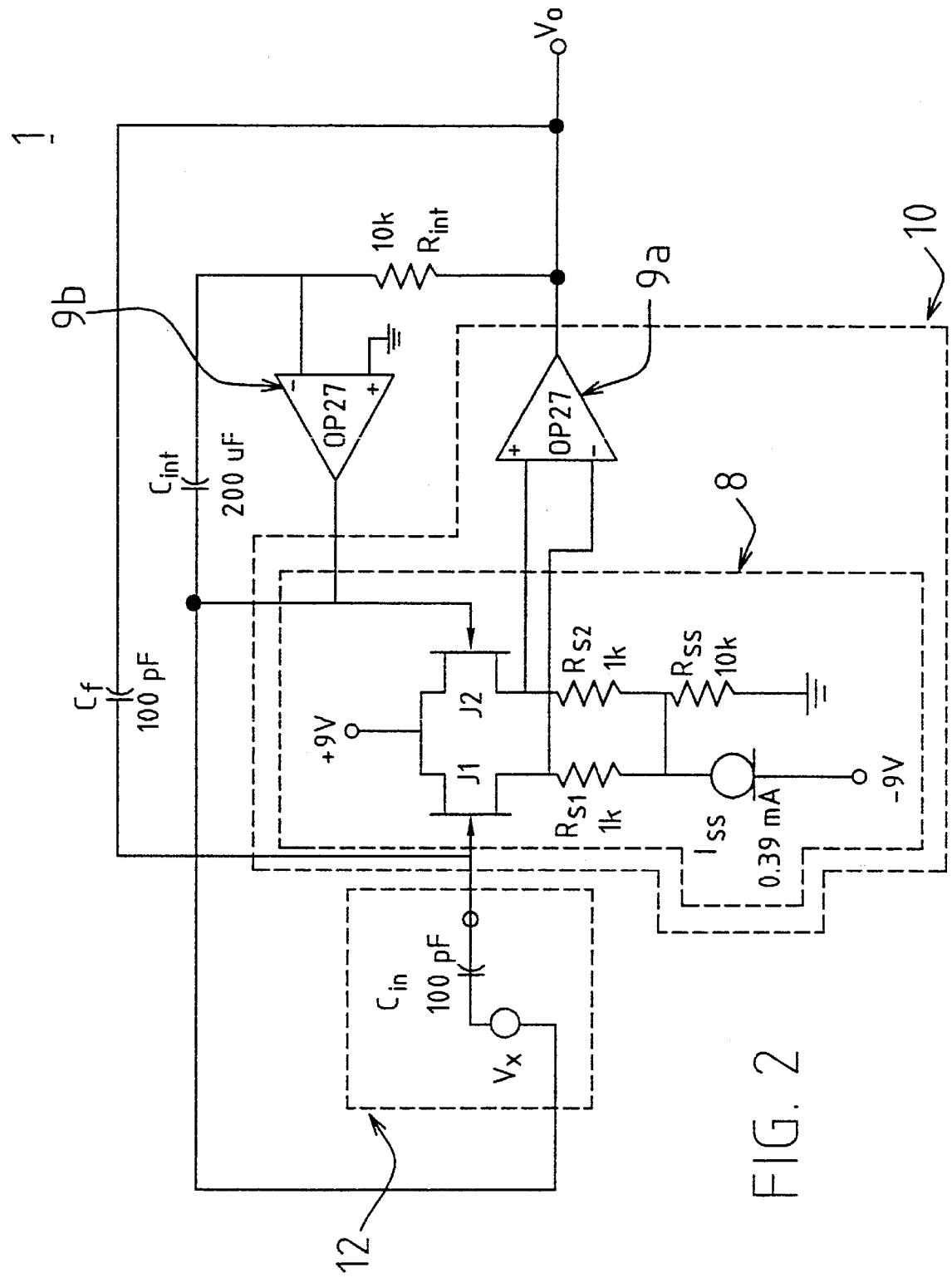
FIG. 2 is a schematic of the Zero Input Current Charge Sensitive Preamplifier of the present invention.
Figure 3:
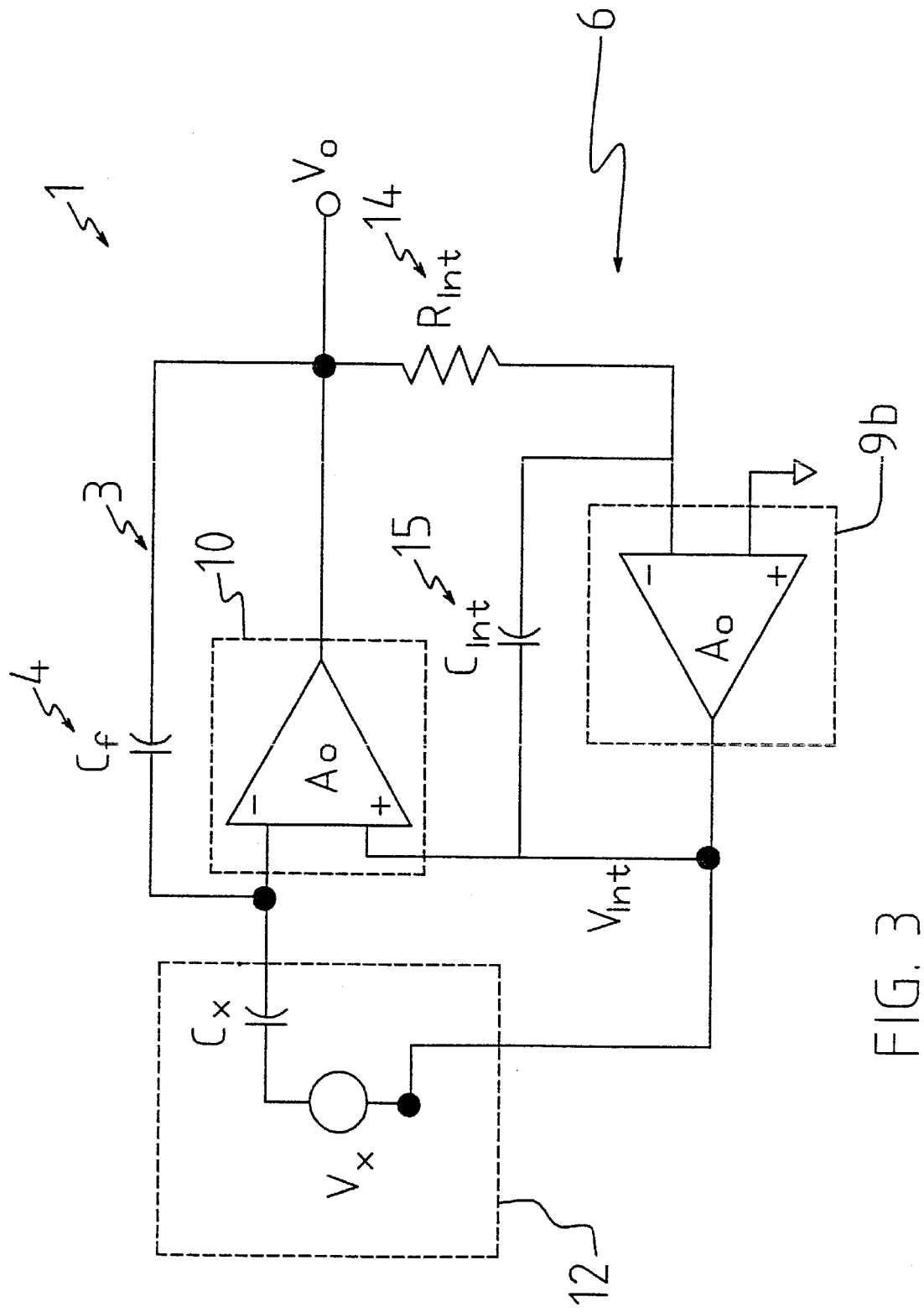
FIG. 3 is a conceptual schematic of the Zero Input Current Charge Sensitive Preamplifier of the present invention.

The Zero Input Current Charge Sensitive Amplifier ("ZIC CSP") (1) of the present invention, shown in FIGS. 2 and 3, controls the bias of the input transistor (2) to obtain zero gate current by utilizing a feedback means whereby an active feedback loop (3) continuously adjusts the bias current of the input differential stage such that gate leakage current is zero. The feedback capacitor (4) senses the magnitude and direction of the leakage current and is used to command the feedback. The present invention can also, optionally, incorporate a charge cancellation means for canceling undesirable low frequency charge which may be generated from thermal effects. The frequency at which this occurs is easily adjustable (via selection of $R_{INT}$ (14) and $C_{INT}$ (15)) and is not a function of the feedback capacitor (4) or the piezo element capacitance (5). The preferred charge cancellation means is thus accomplished in the ZIC CSP (1) of the present invention via feedback through an integrator (6) to the non-inverting input of the front end of the composite operational amplifier (10) and the piezo element (12), as shown in FIG. 2. The integrator (6) is comprised of a resistor ($R_{INT}$) (14), a capacitor ($C_{INT}$) (15) and a monolithic amplifier (9b).

As shown in FIG. 2 the feedback means for achieving zero gate current involves actively adjusting the drain current of the input JFET. The feedback means provided by the present invention is to choose the front end as a differential JFET configuration in which the drain current can be modulated. In the preferred embodiment the configuration of a common drain differential amplifier (8) is selected because the discrete front end is to be coupled with a monolithic operational amplifier (9a) to provide a high open loop gain for the ZIC CSP (1).

Combining a discrete front end with a monolithic operational amplifier is often referred to as a composite operational amplifier (10), for reasons obvious to one of ordinary skill in the art. Composite operational amplifier configurations can be useful when one needs a very low input current, low noise amplifier because it allows use of JFET (7) front end with a subsequent bipolar monolithic operational amplifier (9a). Now that process technologies have advanced greatly, the composite operational amplifier configuration is not used very often. In the case of the ZIC CSP (1), it is used because access to the biasing of the front end JFET transistors (7) was needed, which is not afforded with a monolithic device. In the preferred embodiment an OP27 is used as the monolithic amplifier(9a and 9b), because of its very low noise.

The preferred JFET's (7) are 2N4338's, because they produce quite low noise and are readily accessible. In alternative embodiments other devices having even lower noise can be substituted.

Now that the composite operational amplifier (10) has been described, the preferred means for nulling the gate current at DC and attenuating undesirable low frequency charge from the sensor (12), while allowing charge from the sensor which is in the passband to be amplified normally will be discussed. In the preferred embodiment integrator (6) is placed in the feedback loop (3) from the output to the non-inverting input of the composite operational amplifier (10) and the piezo element (12), as shown in FIG. 2.

With respect to the start up of the ZIC CSP (1), initially, the output is zero so the integrator output is also zero, meaning that the drain current for the differential amplifier (8) is only that due to the constant current diode. Because this current is less than $2 \times I_{DSS}$, the gate to source junctions of the JFET's (7) are reversed biased so leakage current is flowing out of the gates. The leakage current from J1 (7) charges the feedback capacitor, $C_f$, (4) driving the output voltage negative, and the integrator output positive. The integrator output drives the gate of J2 (7) positive, and its source along with it, increasing the overall drain current as the voltage across $R_{SS}$ increases. The increase in drain current causes $V_{GS}$ to decrease, and thus the gate leakage decreases. The drain current continues to increase in this manner until the gate becomes slightly forward biased and its leakage current approaches zero. Likewise, if the current into the gate is too large, the integrator output will be driven down decreasing the drain current. The output voltage, meanwhile, is held to within the offset voltage of U2 from zero because the gain of the integrator (6) is high.

Figure 1:
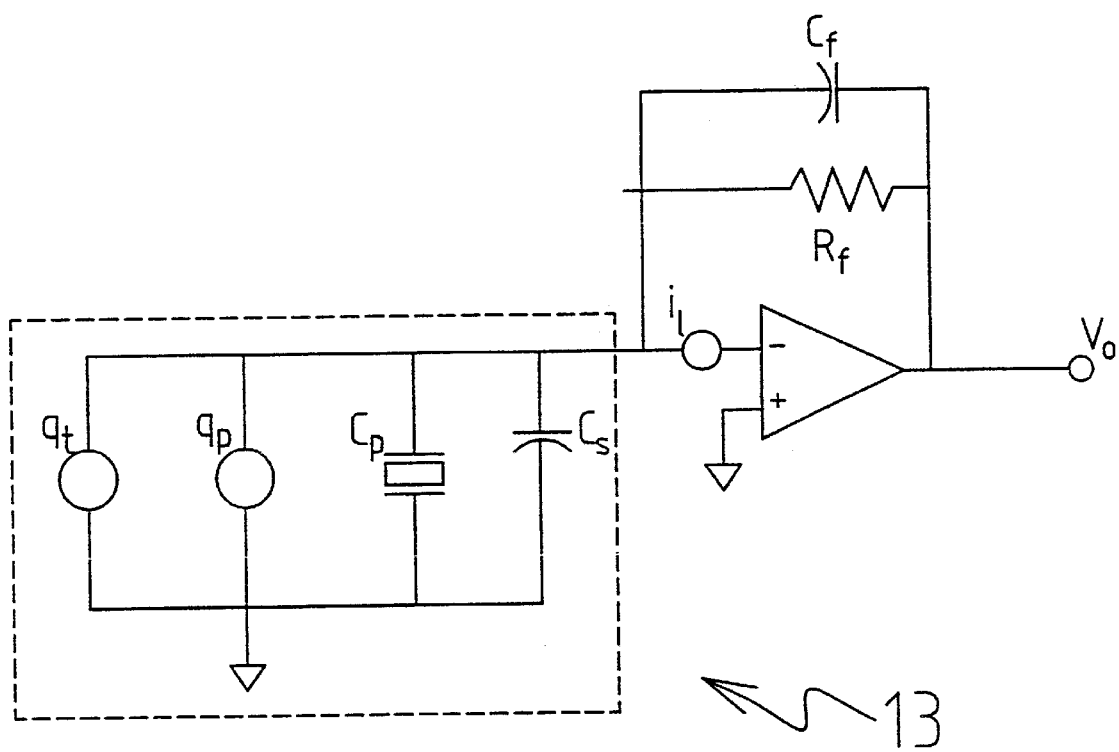
FIG. 1 is a schematic of the classical conventional charge sensitive preamplifier.

With respect to the AC response, the ZIC CSP (1) has a high pass filter type response and will attenuate signals below its cutoff frequency like the classical CSP. The ZIC CSP (1) differs from the classical CSP (13), shown in FIG. 1, because instead of having the non-inverting terminal grounded, it is driven by an integrator (6) whose input is $V_O$ phase shifted by −90°. Since both terminals of the monolithic amplifier (9) must follow each other, the inverting terminal is driven by the same signal. This results in a charge being generated in $C_f$(4) which cancels the undesired signal. Note that none of the cancellation charge flows through the piezo element (12), because both sides are at the same AC potential. The further below the cutoff frequency the signal charge is, the more effectively it is cancelled.

Referring to the conceptual circuit set forth in FIG. 3, assume there is a voltage source, $V_x$ connected to Cx. These two components represent the piezoelectric sensor (12). Unlike the classical CSP (13), the time constant of the ZIC CSP (1) is the time constant of the integrator ($R_{INT} \times C_{INT}$). The noise gain of each source can be calculated to predict the overall noise gain of the ZIC CSP (1).

A noise analysis of the ZIC CSP (1) evidences that as long as the integrator amplifier and the operational amplifier used in the composite amplifier (10) are low noise, such as the OP27, then the thermal noise of the JFET differential stage will dominate. The thermal noise of a JFET (7) is primarily due to the channel resistance, and is minimized by operating the device at a drain current near $I_{DSS}$, which is inherent to the ZIC CSP design. Analysis shows that the noise gain of the JFET thermal noise is $(1+C_x/C_f)$ for frequencies above $1/R_{int}*C_{int}$ rad/s which is the same as the classical CSP (13). The noise of the JFET is typically much lower than that of the feedback resistor traditionally employed.

In practice the ZIC CSP (1) configuration is an effective means of achieving improved resolution over the classical CSP (13) without an excessive increase in complexity. The ZIC CSP (1) makes it possible to actively bias a differential JFET input stage so that its input current is nulled. By removing the high value feedback resistor the low frequency noise may be significantly improved since its thermal noise is eliminated.

Nulling the input current also allows for the implementation of relatively long time constants. In the classical CSP (13) the value of the feedback resistor is limited due to the DC voltage generated across it by the amplifier leakage current. Traditionally, a MOSFET input has been used to reduce the leakage, but this has been at the cost of greatly increased amplifier noise, since MOSFET's are generally noisy relative to JFETs. Thus, by actively controlling leakage current, the ZIC CSP allows long time constants to be achieved using a JFET input. Furthermore, the ZIC CSP actively compensates for variations in JFET gate current due to temperature and other factors.

Although the above describes what are at present the preferred embodiments of the present invention, it will be obvious to those skilled in the art that various changes and modifications may be made therein without departing from the invention and it is, therefore, aimed to cover all such changes and modifications as fall within the true spirit and scope of the invention.

I claim:

1. A charge sensitive preamplifier, comprising:
   a first operational amplifier (9a) having a first non-inverting input, a first inverting input and a first output, said first operational amplifier operatively arranged to amplify an input charge signal and provide an output signal;
   a common drain differential amplifier (8) having a common drain non-inverting input and a common drain inverting input and a common drain output, said common drain output coupled to said first non-inverting input and said first inverting input, respectively, of said first operational amplifier; and,
   a second operational amplifier (9b) having a second inverting input coupled to said first output of said first operational amplifier, and having a second output coupled to said common drain inverting input of said common drain differential amplifier, said second operational amplifier operatively arranged to dynamically bias said common drain differential amplifier to produce zero current continuously into said common drain inverting input of said common drain differential amplifier.

* * * * *